(12) United States Patent
Arai et al.

(10) Patent No.: US 7,629,208 B2
(45) Date of Patent: Dec. 8, 2009

(54) METHOD OF MANUFACTURING THIN FILM TRANSISTOR, THIN FILM TRANSISTOR, AND DISPLAY UNIT

(75) Inventors: Toshiaki Arai, Kanagawa (JP); Yoshio Inagaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 207 days.

(21) Appl. No.: 11/744,299

(22) Filed: May 4, 2007

(65) Prior Publication Data

US 2008/0142800 A1 Jun. 19, 2008

(30) Foreign Application Priority Data

May 10, 2006 (JP) ............................ P2006-131056

(51) Int. Cl.
*H01L 21/00* (2006.01)
*H01L 21/84* (2006.01)

(52) U.S. Cl. ................. 438/153; 438/155; 438/158; 257/72; 257/347; 257/E21.413; 257/E21.414

(58) Field of Classification Search ............... 438/153, 438/155, 158, 161, 166, 149; 257/57, 72, 257/347, E21.094, E21.104, E21.121, E21.413, 257/E21.414

See application file for complete search history.

(56) References Cited

U.S. PATENT DOCUMENTS 5,728,610 A * 3/1998 Gosain et al. ............... 438/162

6,261,881 B1 * 7/2001 Yamazaki et al. ........... 438/161

FOREIGN PATENT DOCUMENTS

| JP | 60-018913 | 1/1985 |
| JP | 3-34647 | 5/1991 |
| JP | 04-212410 | 8/1992 |
| JP | 04-332120 | 11/1992 |
| JP | 05-041390 | 2/1993 |
| JP | 06-132536 | 5/1994 |
| JP | 06-163587 | 6/1994 |
| JP | 07-131030 | 5/1995 |
| JP | 08-228011 | 9/1996 |
| JP | 2002-093702 | 3/2002 |
| JP | 2003-100637 | 4/2003 |

OTHER PUBLICATIONS

Japanese Office Action issued on Apr. 15, 2008.
Japanese Office Action dated Jul. 9, 2008 for Application No. 2006-131056.

* cited by examiner

*Primary Examiner*—Theresa T Doan
(74) *Attorney, Agent, or Firm*—Sonnenschein Nath & Roesnthal LLP

(57) ABSTRACT

A method of manufacturing a thin film transistor capable of inhibiting the characteristics variation of the thin film transistor without deteriorating the characteristics thereof is provided. A crystalline silicon film is formed by indirect heat treatment through a photothermal conversion layer and a buffer layer. By patterning the buffer layer and an insulating film, a channel protective film is selectively formed in a region corresponding to a channel region on the crystalline silicon film. Further, when an n+ silicon film and a metal layer are selectively removed, the channel protective film functions as an etching stopper. When the crystalline silicon film is formed, heat is uniformly supplied. Further, in etching, the channel region of the crystalline silicon film is protected.

3 Claims, 12 Drawing Sheets

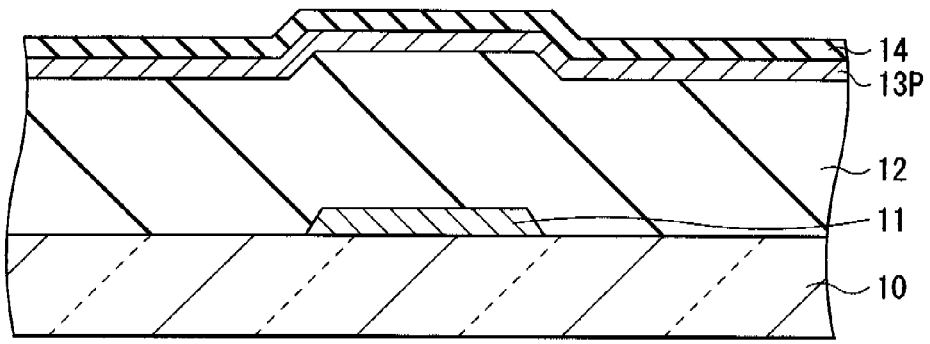
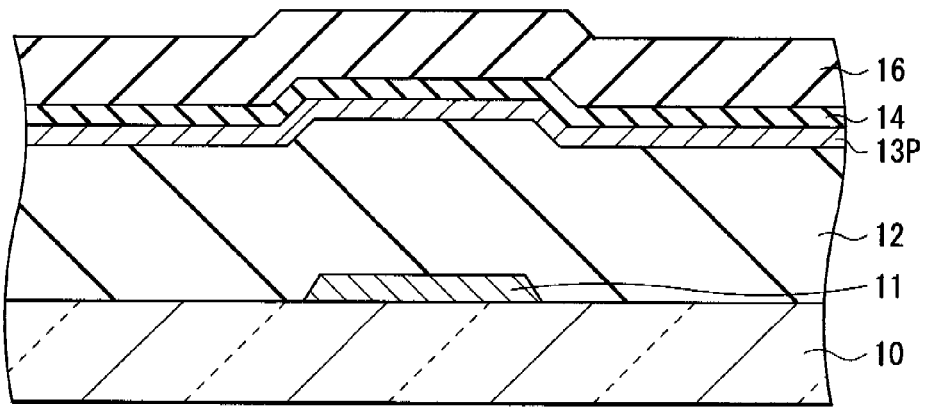
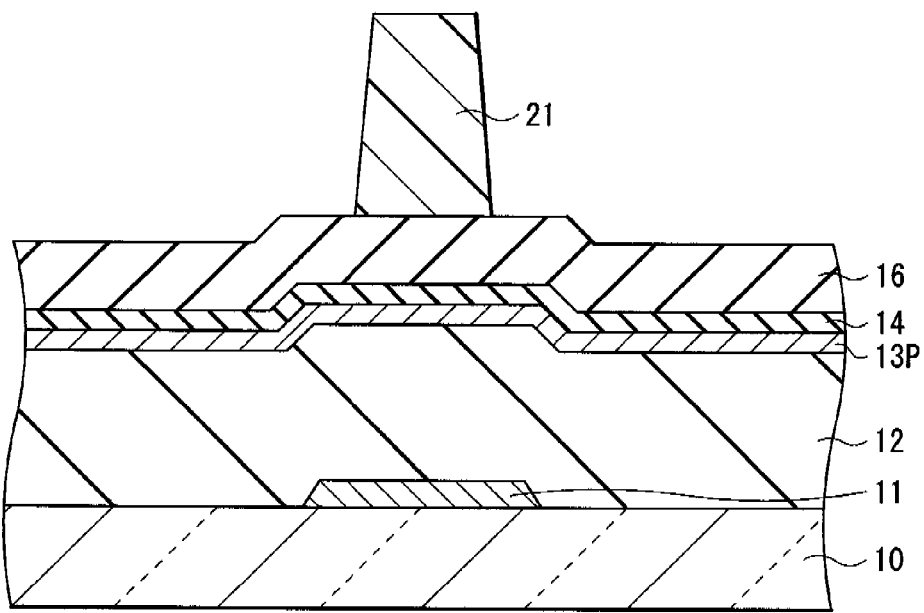

METHOD OF MANUFACTURING THIN FILM TRANSISTOR, THIN FILM TRANSISTOR, AND DISPLAY UNIT

CROSS REFERENCES TO RELATED APPLICATIONS

The present invention contains subject matter related to Japanese Patent Application JP 2006-131056 filed in the Japanese Patent Office on May 10, 2006, the entire contents of which being incorporated herein by reference.

BACKGROUND OF THE INVENTION

1. Field of the Invention

The present invention relates to a method of manufacturing a thin film transistor in which an amorphous silicon film is crystallized by using heat treatment with a laser beam, a thin film transistor obtained with the use of such crystallization, and a display unit including such a thin film transistor.

2. Description of the Related Art

In these years, as one of flat panel displays, an organic EL display unit that displays images by using organic EL (Electro Luminescence) phenomenon has been noted. The organic EL display unit has superior characteristics that the view angle is wide and the power consumption is small since the organic EL display unit uses light emitting phenomenon of organic light emitting device itself. Further, the organic EL display unit has high response to high-definition high-speed video signals, and thus the organic EL display unit is under development toward the practical use particularly in the image field.

Of driving methods in the organic EL display unit, active matrix method using a thin film transistor (TFT) as a driving device is more superior to passive matrix method in terms of responsibility and resolution. Therefore, the active matrix method is regarded as a particularly suitable driving method in the organic EL display unit having the foregoing advantages. The active matrix organic EL display unit has a driving panel in which an organic EL device including an organic light emitting layer and the driving device (the foregoing thin film transistor) for driving the organic EL display device are arranged. The driving panel and a sealing panel are bonded to each other with an adhesive layer in between, so that the organic EL device is sandwiched between the driving panel and the sealing panel.

It is known that in the thin film transistor as the driving device, when the voltage is continuously applied to the gate electrode, the threshold voltage of the transistor is shifted. When the threshold voltage of the thin film transistor is shifted, the current amount flowing into the transistor is changed. In the result, the luminance of the organic EL device composing each pixel is changed. However, some of the thin film transistors of the organic EL display unit need to maintain a conductive state as long as the organic EL device emits light. Therefore, it has been difficult to inhibit the shift phenomenon of the threshold voltage.

Therefore, in these days, to inhibit the shift phenomenon of the threshold voltage, the following organic EL display unit is developed. In the organic EL display unit, a channel region of the thin film transistor is made of a crystalline silicon film. The crystalline silicon film is obtained by irradiating an amorphous silicon (a-Si) layer formed on a glass substrate with an excimer laser beam to provide annealing treatment.

However, when the crystalline silicon film is formed by annealing treatment with the use of the excimer laser beam, there is the following shortcoming. That is, when heat distribution is caused by energy distribution in the irradiation area or energy variation among pulses of the laser beam, crystallinity of the crystalline silicon film becomes uneven in the crystal face. Thus, characteristics of the thin film transistor vary.

Therefore, for example, in Japanese Unexamined Patent Application Publication Nos. 60-18913, 4-332120 and 2002-93702, and Japanese Examined Patent Application Publication No. 3-34647, the following technique is proposed. In the technique, a photothermal conversion layer is formed on an amorphous silicon film, the photothermal conversion layer is irradiated with an excimer laser beam, and thereby the amorphous silicon film is crystallized. According to the technique, the calories necessary for crystallizing the amorphous silicon film can be indirectly provided by using the photothermal conversion. Therefore, uniform crystallization in the crystalline silicon film is realized, and in the result, a thin film transistor having the uniform electric characteristics can be obtained.

More specifically, in the method not using the photothermal conversion layer, the amorphous silicon film is directly irradiated with a laser beam and crystallized by using laser having the absorption wavelength corresponding to the silicon film. In this case, however, for example, in the large substrate being 300 mm to 920 mm in one side, the film thickness variation of about 10% is generated. Therefore, when the amorphous silicon film is thinned, the absorption ratio of the laser beam is lowered, leading to crystallinity variation. Meanwhile, in the method using the photothermal conversion layer, as long as the surface reflectance and the film thickness of the photothermal conversion layer are uniform, it is possible to realize uniform crystallization independently of the wavelength of the laser beam and the film thickness of the silicon film.

SUMMARY OF THE INVENTION

However, when such a photothermal conversion layer is used, it is often the case that at a high temperature (at least 1410 degree C. that is the melting point of silicon), the photo thermal conversion layer and the silicon film are reacted, and thus an unnecessary compound is generated. Therefore, to prevent such a compound from being generated, for example, in the foregoing Japanese Unexamined Patent Application Publication Nos. 60-18913 and 4-332120, and Japanese Examined Patent Application Publication No. 3-34647, a buffer layer is previously formed between the photothermal conversion layer and the amorphous silicon film. As the buffer layer, for example, a silicon oxide film (SiO), a silicon nitride film (SiN), a silicon oxide nitride film (SiON) or the like can be cited. Further, after the silicon film is recrystallized, the buffer layer is removed by, for example, wet etching with the use of hydrogen fluoride (HF).

When the silicon film is recrystallized, the buffer layer is provided with heat at the melting point of the silicon film or more. Therefore, the buffer layer has been altered, and thus is hardly etched. In the result, an etching residue is easily generated. When the etching residue exists on the crystalline silicon film, conductivity between a channel region and a source/drain region is thereby affected. In the result, there are shortcomings as follows. That is, a leak path is formed between the crystalline silicon film and the upper layer thereof, leading to increase of the off-current, or the interface level is formed and thus the threshold voltage of the thin film transistor is varied, or the so-called S value (slope value) is increased.

Meanwhile, when sufficient etching is provided for the buffer layer to prevent such etching residue from being generated, there are the following shortcomings. That is, hydrogen fluoride solution entering through a pin hole existing on the crystalline silicon film also etches the gate insulating film, and thereby interlayer insulation of the gate insulating film is lowered. In addition, the crystalline silicon film forming the channel region is damaged, and the on-characteristics are lowered.

To reduce the etching residue of the buffer layer, for example, the following methods are effective. That is, after treatment with hydrogen fluoride solution, water washing treatment is made. Otherwise, before forming the upper layer of the buffer layer by CVD (Chemical Vapor Deposition) method, plasma treatment is made by using an etching gas such as hydrogen and argon in a CVD chamber. However, even in the foregoing methods, the crystalline silicon film as a channel is damaged, and when the treatment is made excessively, the on-current is lowered.

As above, in the existing technique in which the buffer layer necessary for crystallizing the silicon film is removed after the crystallization of the silicon film, it has been difficult to realize a uniform crystallization of the crystalline silicon film and to inhibit the characteristics variation of the thin film transistor without deteriorating the characteristics of the thin film transistor.

In view of the foregoing, in the invention, it is desirable to provide a method of manufacturing a thin film transistor capable of inhibiting the characteristics variation without deteriorating the characteristics of the thin film transistor, a thin film transistor, and a display unit.

According to an embodiment of the invention, there is provided a method of manufacturing a thin film transistor including the steps of: forming a gate electrode, a gate insulating film, a first amorphous silicon film, and a first insulating layer over an insulative substrate in this order; forming a photothermal conversion layer on the first insulating layer; forming a crystalline silicon film by crystallizing the first amorphous silicon film by irradiating the photothermal conversion layer with a light beam to provide heat treatment for the first amorphous silicon film through the photothermal conversion layer and the first insulating layer; removing the photothermal conversion layer; forming a channel protective film by patterning the first insulating layer to selectively leave only a region thereof corresponding to a channel region of the crystalline silicon film; and forming a source region and a drain region from an n+ silicon film and forming a source electrode and a drain electrode from a metal layer by forming the n+ silicon film and the metal layer on the channel protective film and the crystalline silicon film in this order, patterning the crystalline silicon film and the n+ silicon film to selectively leave only a region thereof corresponding to the gate electrode, and selectively removing a region corresponding to the channel region in the n+ silicon film and the metal layer with the use of the channel protective film as an etching stopper.

In the method of manufacturing a thin film transistor of the embodiment of the invention, the heat treatment is indirectly provided through the photothermal conversion layer and the first insulating layer. Therefore, heat is uniformly transferred to the first amorphous silicon film to form the crystalline silicon film. Further, since the first insulating layer is formed between the first amorphous silicon film and the photothermal conversion layer, a product is not generated due to reaction thereof. After that, the photothermal conversion layer is removed, the first insulating layer is patterned to selectively leave only the region thereof corresponding to the channel region, and thereby such region becomes the channel protective film. At this time, since the portion to become the channel protective film is not removed, the channel region in the crystalline silicon film as a lower layer is protected and is not damaged. After that, as an upper layer of the channel protective film, the n+ silicon film and the metal film are formed, and the region thereof corresponding to the channel region is selectively removed, and thereby the source region, the drain region, the source electrode, and the drain electrode are respectively formed. The channel protective film functions as the etching stopper. Therefore, the channel region of the crystalline silicon film is protected and is not damaged.

In the method of manufacturing a thin film transistor according to the embodiment of the invention, it is preferable that a step of forming a second insulating layer on the first insulating layer is included after the step of removing the photothermal conversion layer. It is preferable that the first and the second insulating layers are patterned to selectively leave only a region corresponding to the channel region, and thereby the channel protective film is formed. In this case, the film thickness of the channel protective film functioning as the etching stopper becomes large. Therefore, the channel region of the crystalline silicon film is more surely protected.

According to an embodiment of the invention, there is provided a thin film transistor including: a crystalline silicon film that is formed over an insulative substrate with a gate electrode and a gate insulating film in between, and has a channel region in a region corresponding to the gate electrode; an insulative channel protective film that is selectively formed in a region corresponding to the channel region on the crystalline silicon film; an n+ silicon film having a source region and a drain region that sandwich a region corresponding to the channel region on the channel protective film and the crystalline silicon film; and a metal film having a source electrode and a drain electrode that respectively correspond to the source region and the drain region.

According to an embodiment of the invention, there is provided a display unit including a plurality of display devices, and the thin film transistor that performs a given driving operation for the plurality of display devices.

In the thin film transistor and the display unit of the embodiment of the invention, the channel protective film is selectively formed in the region corresponding to the channel region on the crystalline silicon film. Therefore, when the channel protective film is formed, the channel region of the crystalline silicon film is protected and not damaged. Further, when the source region, the drain region, the source electrode, and the drain electrode are formed as an upper layer of the channel protective film, the channel protective layer functions as the etching stopper. Therefore, the channel region of the crystalline silicon film is protected and not damaged.

In the thin film transistor and the display unit of the embodiment of the invention, the foregoing channel protective film may be formed by patterning the insulating film uniformly formed on the crystalline silicon film. The foregoing crystalline silicon film may be formed by the heat treatment in which the amorphous silicon film is irradiated with the light beam through the photothermal conversion layer and the foregoing insulating film. The foregoing photothermal conversion layer may be removed after the heat treatment.

According to the method of manufacturing a thin film transistor, the thin film transistor, and the display unit of the embodiment of the invention, the crystalline silicon film is formed by the heat treatment through the photothermal conversion layer and the insulating film (first insulating film). In addition, the channel protective film is selectively formed in the region corresponding to the channel region on the crystalline silicon film by patterning the insulating film. Therefore, crystallization can be made by the indirect heat treatment. In addition, when the insulating film is peeled, the channel protective film can mask the channel region of the crystalline silicon film, and when the n+ silicon film and the metal film are selectively removed, the channel protective film can function as the etching stopper. Therefore, when the crystalline silicon film is formed, heat can be uniformly supplied, the channel region of the crystalline silicon film can be protected, and the characteristics variation of the thin film transistor can be inhibited without deteriorating the characteristics thereof.

Other and further objects, features and advantages of the invention will appear more fully from the following description.

BRIEF DESCRIPTION OF THE DRAWINGS

FIGS. 2A, 2B, and 2C are cross sections showing steps following FIGS. 1A and 1B;

DETAILED DESCRIPTION OF THE PREFERRED EMBODIMENTS

Embodiments of the invention will be hereinafter described in detail with reference to the drawings.

First Embodiment

FIG. 1A to FIG. 5B are views for explaining a method of manufacturing a thin film transistor (thin film transistor 1) according to a first embodiment of the invention.

Figure 1A:
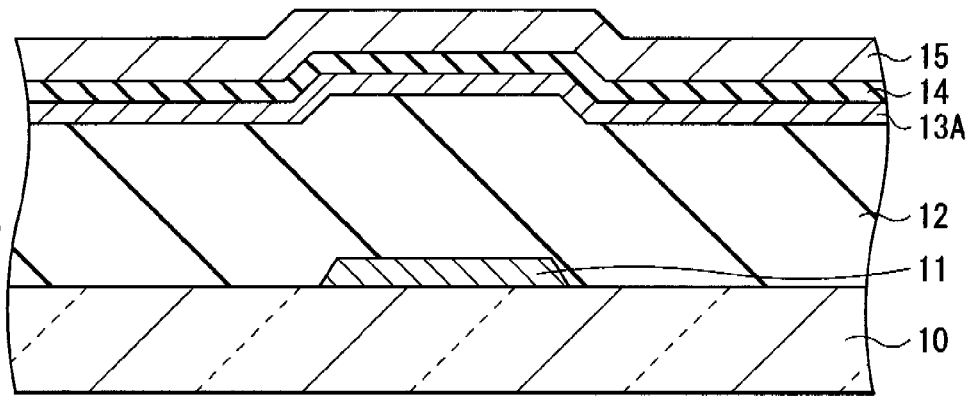
FIGS. 1A and 1B are cross sections showing part of main steps of a method of manufacturing a thin film transistor according to a first embodiment of the invention.

First, as shown in FIG. 1A, a gate electrode 11, a gate insulating film 12, an amorphous silicon film 13A (first amorphous silicon film), a buffer layer 14 (first insulating film), and a photothermal conversion layer 15 are formed in this order over an insulative substrate 10 made of a glass material and a plastic material.

More specifically, the gate electrode 11 is formed as follows. A molybdenum (Mo) film being about 100 nm thick is uniformly formed on the substrate 10 by, for example, sputtering method. After that, the molybdenum film is etched and patterned in a given shape. The patterning into such a given shape is made by, for example, photolithography method or the like. The gate electrode 11 is not necessarily made of Mo, but may be made of a metal with the high melting point that is hardly altered by heat generated when the amorphous silicon film 13A is crystallized afterward (refer to FIG. 1B).

Further, the gate insulating film 12 is formed as follows. That is, for example, by plasma CVD method, silicon oxide ($SiO_2$) being about 160 nm thick is uniformly formed on the substrate 10 including the gate electrode 11. The gate insulating film 12 is not necessarily made of $SiO_2$, but may be made of an insulating material formed of at least one selected from the group consisting of $SiO_2$, silicon nitride (SiN), and silicon oxide nitride (SiON).

The amorphous silicon film 13A being about 30 nm thick is uniformly formed on the gate insulating film 12 by, for example, plasma CVD method.

Further, the buffer layer 14 is formed as follows. $SiO_2$ being about 40 nm thick is uniformly formed on the amorphous silicon film 13A by, for example, plasma CVD method. Again, the buffer layer 14 is not necessarily made of $SiO_2$, but may be made of an insulating material formed of at least one selected from the group consisting of $SiO_2$, SiN, and SiON.

The photothermal conversion layer 15 is formed as follows. Mo being about 100 nm thick is uniformly formed on the buffer layer 14. The photothermal conversion layer 15 is for absorbing the after-mentioned laser beam or the like and for converting light energy to heat energy. Therefore, as the photothermal conversion layer 15, any material may be used as long as the following conditions and the like are satisfied. That is, any material may be used as long as the material has the high absorption ratio of the laser beam used for subsequent crystallization (FIG. 1B), has the low thermal diffusion rate to the buffer layer 14 and the amorphous silicon film 13A, and is a material with the high melting point that is hardly altered by the heat generated in the subsequent crystallization. For example, carbon (C) or the like may be used as well.

Figure 1B:
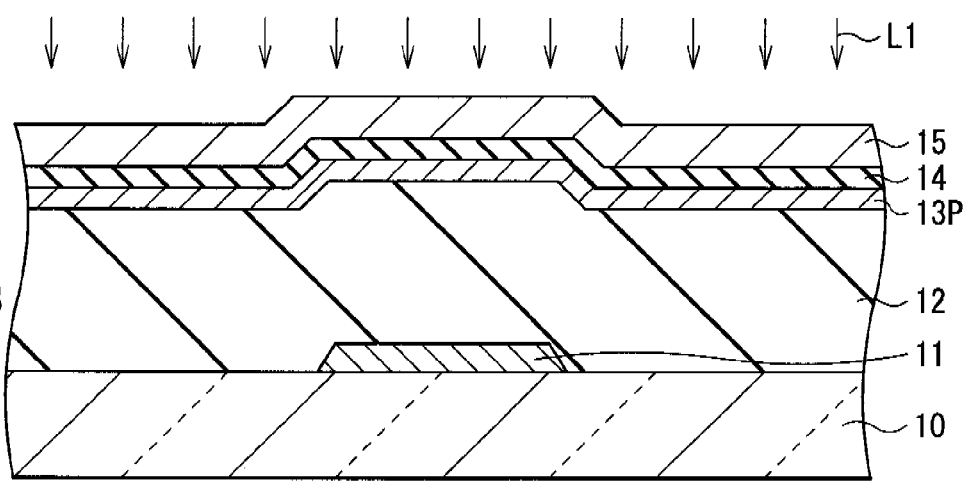

Subsequently, as shown in FIG. 1B, the photothermal conversion layer 15 is uniformly irradiated with a laser beam L1, and heat treatment is indirectly provided for the amorphous silicon film 13A through the photothermal conversion layer 15 and the buffer layer 14. Thereby, the amorphous silicon film 13A is crystallized, and becomes a crystalline silicon film (polysilicon film) 13P. Further, since the heat treatment is indirectly provided for the amorphous silicon film 13A through the photothermal conversion layer 15 and the buffer layer 14, heat is uniformly transmitted to the amorphous silicon film 13A, and thus the amorphous silicon film 13A is uniformly crystallized. As a light source laser, either a continuous wave or a pulse wave may be used. A laser beam in any wavelength region may be used as long as the laser beam can totally pass the photothermal conversion layer 15, but a laser beam with the high absorption in the photothermal conversion layer 15 is desirable. In the case that the reflectance in the photothermal conversion layer 15 is high, for example, $SiO_2$ or the like with the appropriate film thickness may be formed on the photothermal conversion layer 15 as a reflection suppressing film of the laser beam L1.

Subsequently, as shown in FIG. 2A, the photothermal conversion layer 15 that is not necessary after crystallizing the amorphous silicon film 13A is removed by etching.

Subsequently, as shown in FIG. 2B, for example, by plasma CVD method, an insulating film 16 (second insulating film) being about 200 nm thick is uniformly formed on the buffer layer 14. The insulating film 16 is made of an insulating material formed of at least one selected from the group consisting of $SiO_2$, SiN, and SiON.

Subsequently, as shown in FIG. 2C, a photoresist film 21 is formed on the insulating film 16, and is patterned in a given shape. More specifically, the photoresist film 21 is selectively formed in a region corresponding to a portion to become a channel region of the crystalline silicon film 13P.

Figures 3A, 3B:
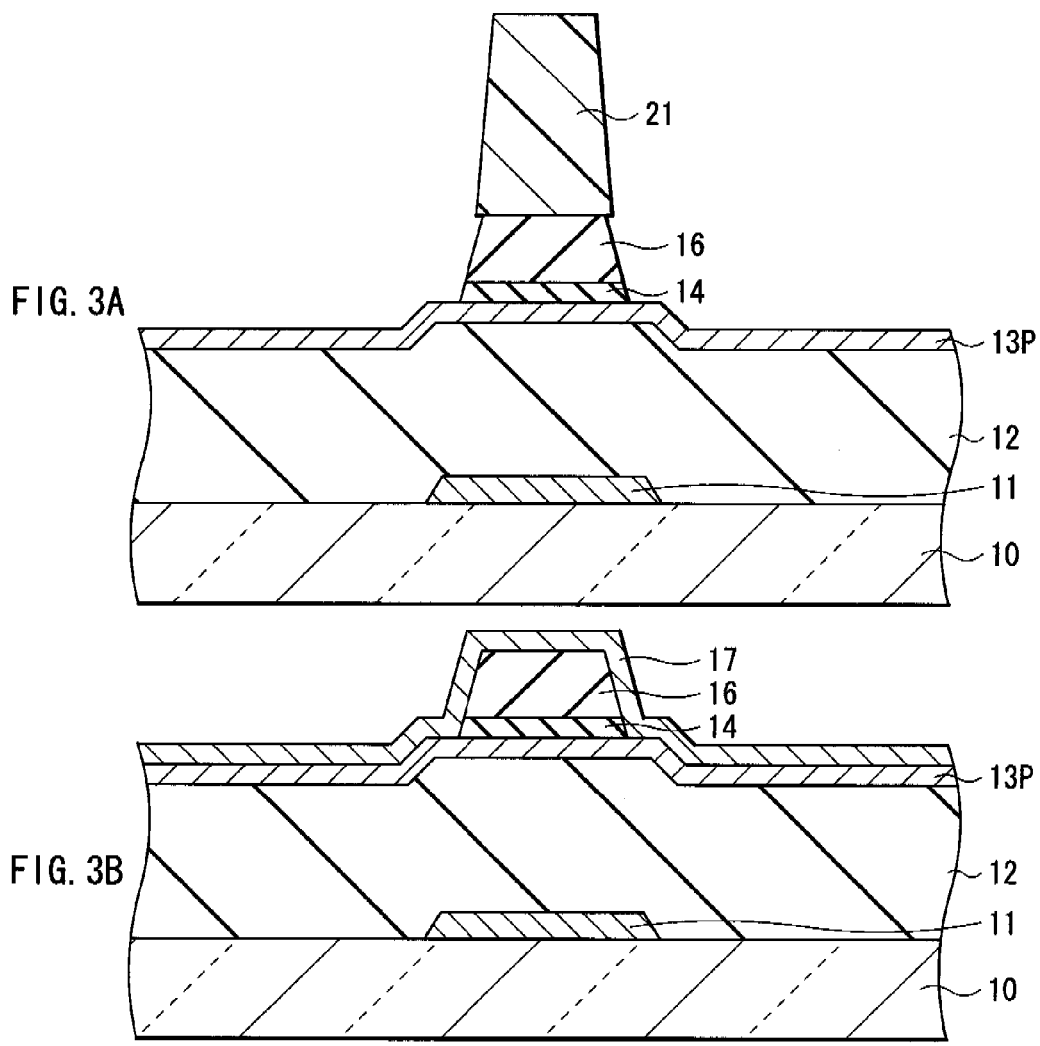
FIGS. 3A and 3B are cross sections showing steps following FIGS. 2A, 2B, and 2C.

Subsequently, as shown in FIG. 3A, a portion where the photoresist film 21 does not remain in the buffer layer 14 and the insulating film 16, that is, a portion other than a region corresponding to the portion to become the channel region of the crystalline silicon film 13P is removed by wet etching with the use of a hydrofluoric acid solution. Thereby, a channel protective film composed of the buffer layer 14 and the insulating film 16 is formed. Then, the portion to become the channel region of the crystalline silicon film 13P is protected by being masked by the channel protective film, and thus is not damaged by etching.

Subsequently, as shown in FIG. 3B, after the photoresist film 21 is removed, an n+ silicon film 17 being about 50 nm thick for forming a source region and a gate region described later is uniformly formed on the crystalline silicon film 13P including the channel protective film by, for example, plasma CVD method.

Figure 4:
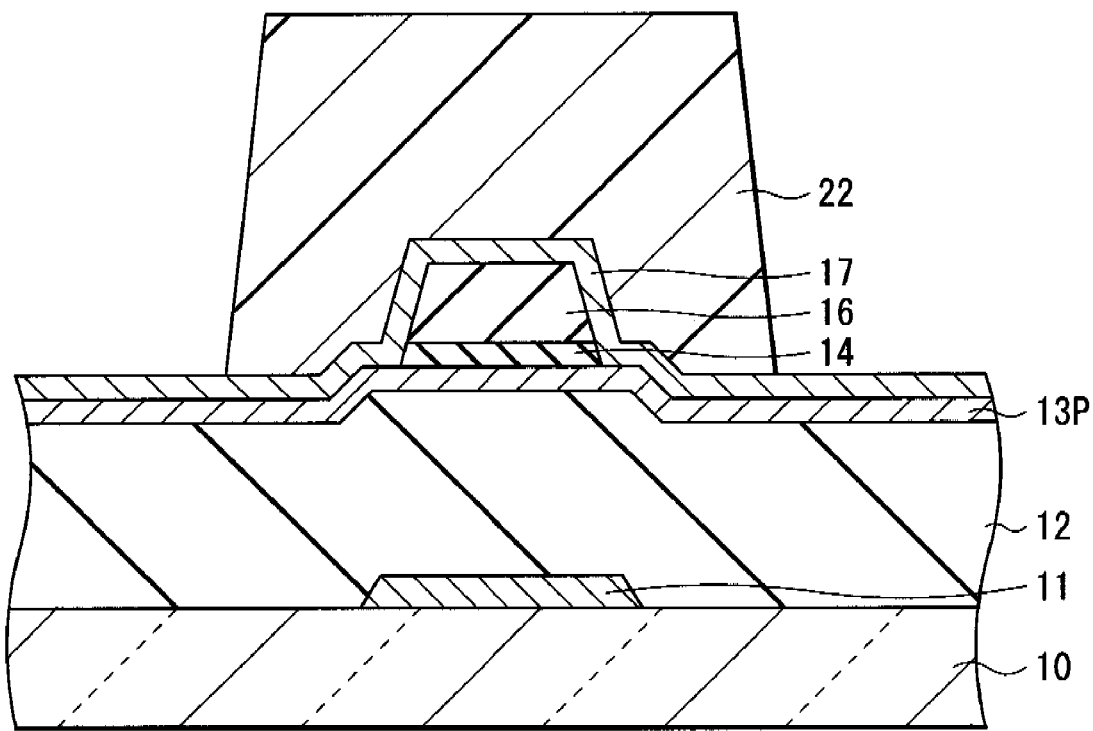
FIG. 4 is a cross section showing a step following FIGS. 3A and 3B.

Subsequently, as shown in FIG. 4, a photoresist film 22 is formed on the n+ silicon film 17 and patterned in a given shape. More specifically, the photoresist film 22 is selectively formed in a region corresponding to the gate electrode 11.

Figure 5A:
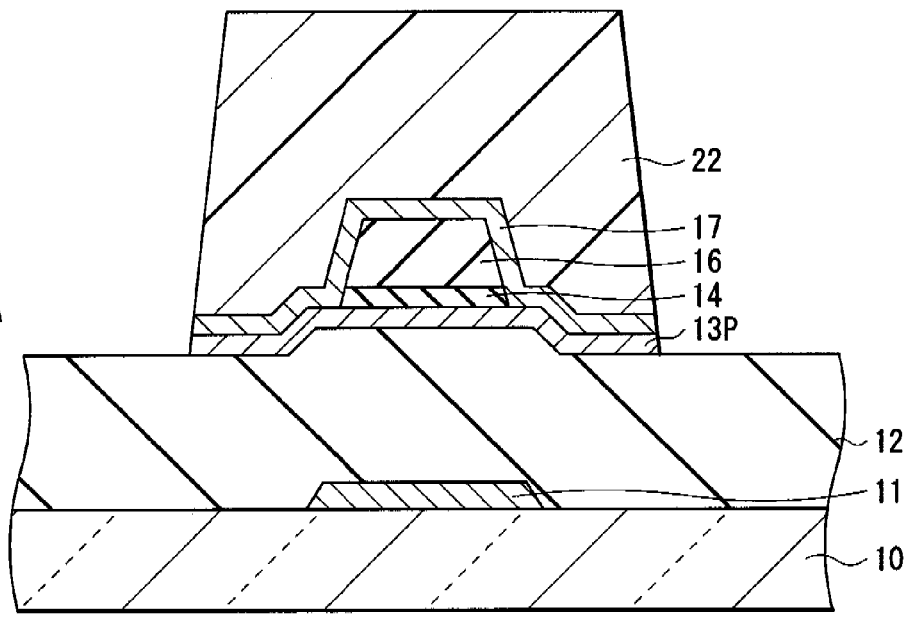
FIGS. 5A and 5B are cross sections showing steps following FIG. 4.

Subsequently, as shown in FIG. 5A, a portion where the photoresist film 22 does not remain in the crystalline silicon film 13P and the n+ silicon film 17, that is, a portion other than a region corresponding to the gate electrode 11 is removed by etching. Thereby, an island pattern composed of the crystalline silicon film 13P and the n+ silicon film is formed.

Figure 5B:
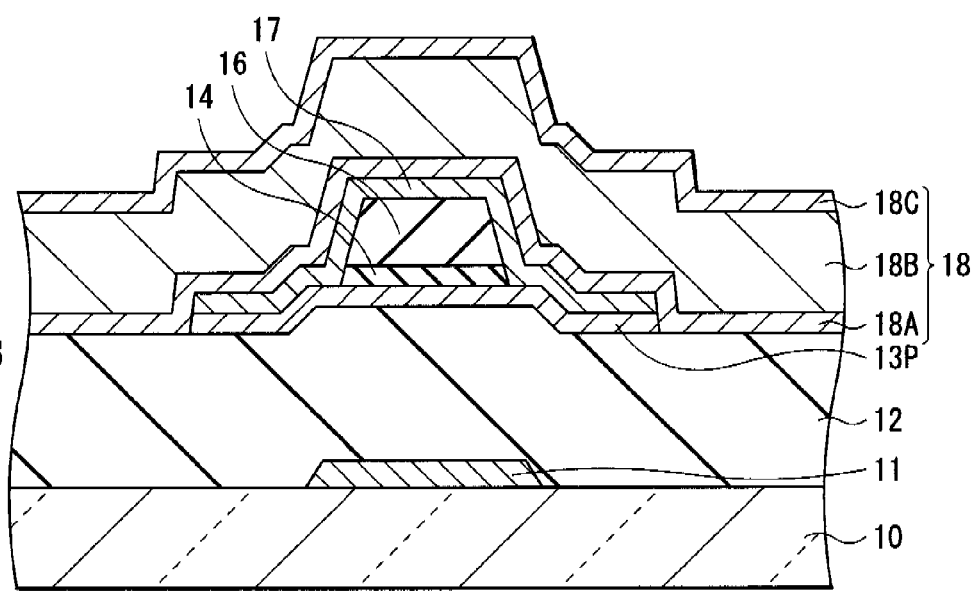

Subsequently, as shown in FIG. 5B, a three-layer structure metal layer 18 is uniformly formed on the gate insulating film 12 including the n+ silicon film 17 by, for example, sputtering method. More specifically, for example, a titanium (Ti) layer 18A being about 50 nm thick, an aluminum (Al) layer 18B being 250 nm thick, and a Ti layer 18C being about 50 nm thick are layered in this order. As the metal layer 18, in addition to the foregoing materials, molybdenum (Mo), chromium (Cr), or a lamination structure including Mo/Al/Mo may be used.

Figure 6A:
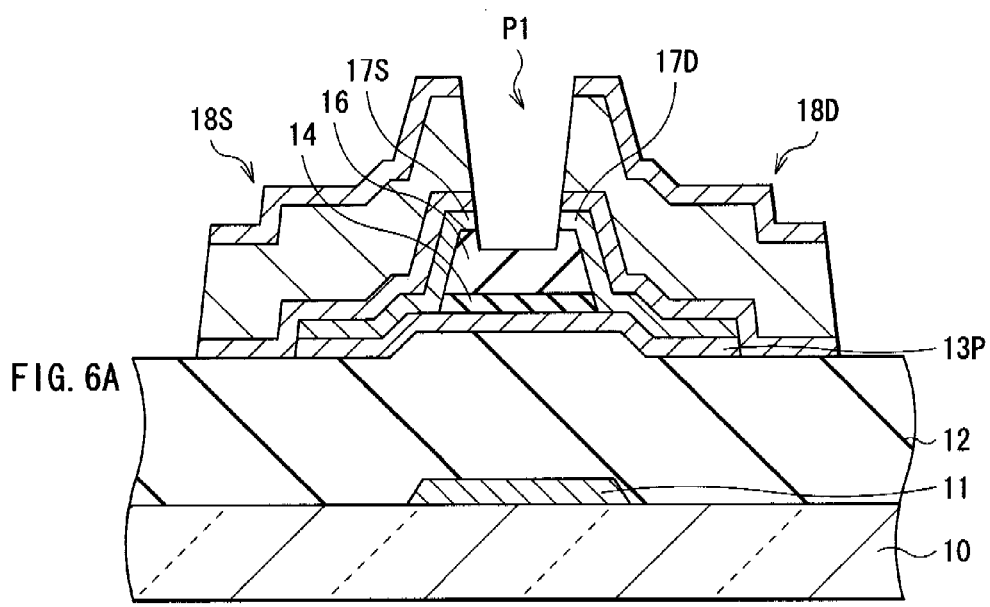
FIGS. 6A and 6B are cross sections showing steps following FIGS. 5A and 5B.

Subsequently, as shown in FIG. 6A, the n+ silicon film 17 and the metal layer 18 are patterned in a given shape. Thereby, a source region 17S and a drain region 17D are respectively formed from the n+ silicon film 17, and a source electrode 18S and a drain electrode 18D are respectively formed from the metal layer 18. More specifically, the both ends of the n+ silicon film 17 and the metal layer 18 and a region corresponding to the portion to become the channel region of the crystalline silicon film 13P in the n+ silicon film 17 and the metal layer 18 are selectively removed by etching. Then, to avoid etching residual of these layers, overetching is made as indicated by symbol P1 in the figure. Then, since the channel protective film composed of the buffer layer 14 and the insulating film 16 with the sufficient film thickness functions as an etching stopper, the channel region of the crystalline silicon film 13P is protected and is not damaged.

Figure 6B:
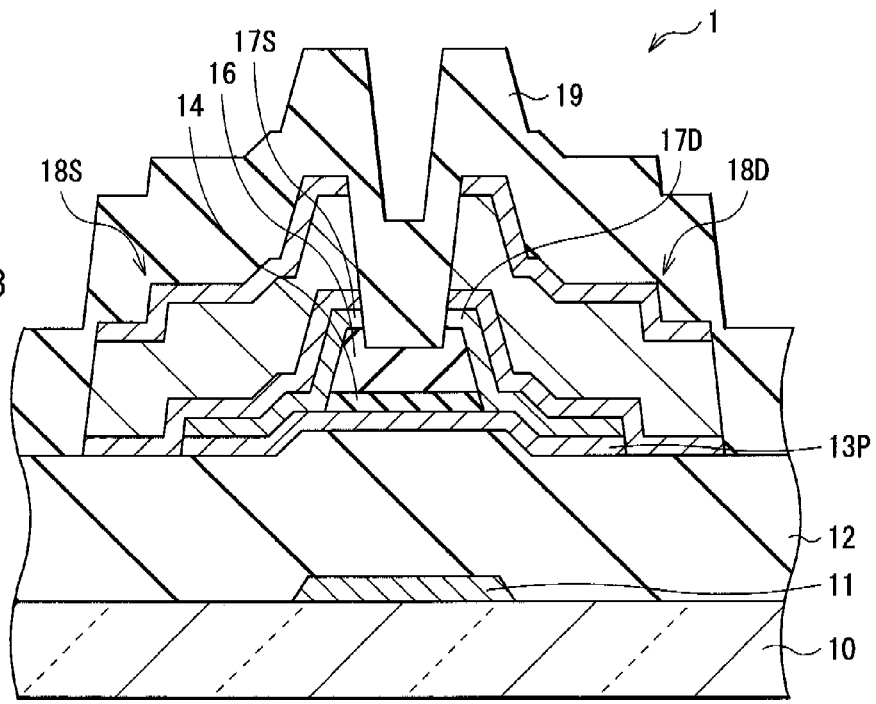

Finally, as shown in FIG. 6B, for example, by plasma CVD method, a passivation film 19 being about 200 nm thick is uniformly formed on the gate insulating film 12 including the source electrode 18S, the drain electrode 18D, and the channel protective film. Thereby, the thin film transistor 1 of this embodiment is formed. Again, the passivation film 19 is made of an insulating material formed of at least one selected from the group consisting of $SiO_2$, SiN, and SiON, for example.

In the thin film transistor 1, when the gate voltage Vg of a given threshold value voltage or more is applied between the gate electrode 11 and the source electrode 18S through a not shown wiring layer, the channel region is formed in the crystalline silicon 13P, and the current (drain current Id) flows between the source electrode 18S and the drain electrode 18D through the source region 17S and the drain region 17D. Thereby, the thin film transistor 1 functions as a transistor.

The crystalline silicon film 13P has been crystallized by the indirect heat treatment through the already separated photothermal conversion layer 15 and the buffer layer 14. Therefore, being provided with uniform heat in crystallization, the crystalline silicon film 13P is formed. Then, the buffer layer 14 is formed between the first amorphous silicon film 13A and the photothermal conversion layer 15. Therefore, a product is not generated due to the reaction between the first amorphous silicon film 13A and the photothermal conversion layer 15. In the result, the transistor characteristics are not deteriorated due to such a product.

Further, in the region corresponding to the channel region on the crystalline silicon film 13P, the channel protective film is selectively formed by patterning the buffer layer 14 and the insulating film 16. Therefore, when the insulating film 16 is peeled (refer to FIG. 4 and FIG. 5A), the channel region of the crystalline silicon film 13P is protected and is not damaged. Further, when the source region 17S, the drain region 17D, the source electrode 18S, and the drain electrode 18D are formed as an upper layer of the protective film, the channel protective layer functions as an etching stopper as well. Therefore, the channel region of the crystalline silicon film 13P is protected and is not damaged.

Figure 7:
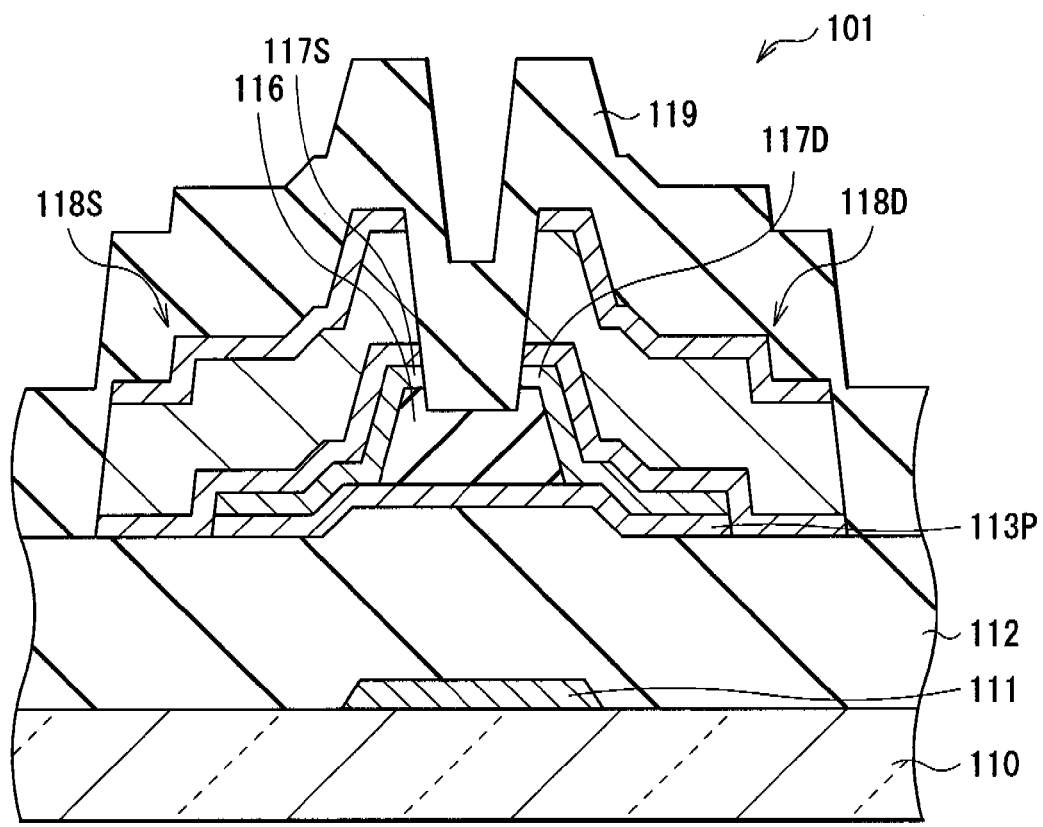
FIG. 7 is a cross section showing a structure of a thin film transistor according to a comparative example.
Figure 8:
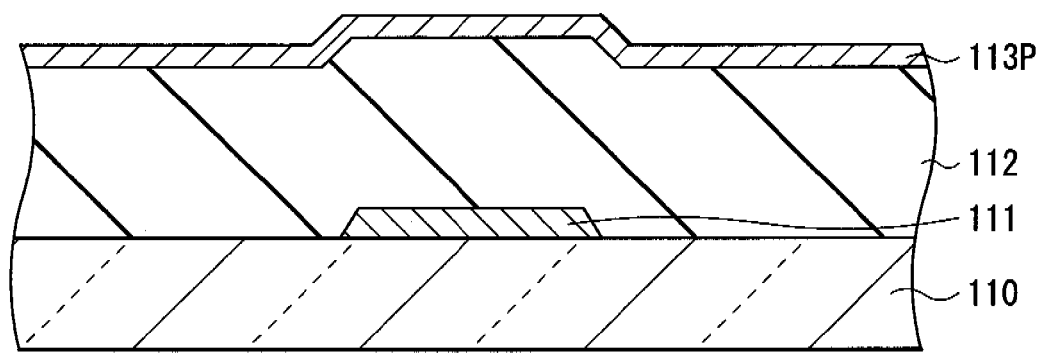
FIG. 8 is a cross section showing part of main steps of a method of manufacturing the thin film transistor shown in FIG. 7.

Meanwhile, for example, in a thin film transistor 101 of the related art (comparative example) shown in FIG. 7, as shown in FIG. 8, after a crystalline silicon film 113P is formed, a buffer layer as an upper layer thereof (not shown) is completely removed by wet etching with the use of a hydrofluoric acid solution. Therefore, the channel region of the crystalline silicon film 13P is damaged by the etching.

Figure 9:
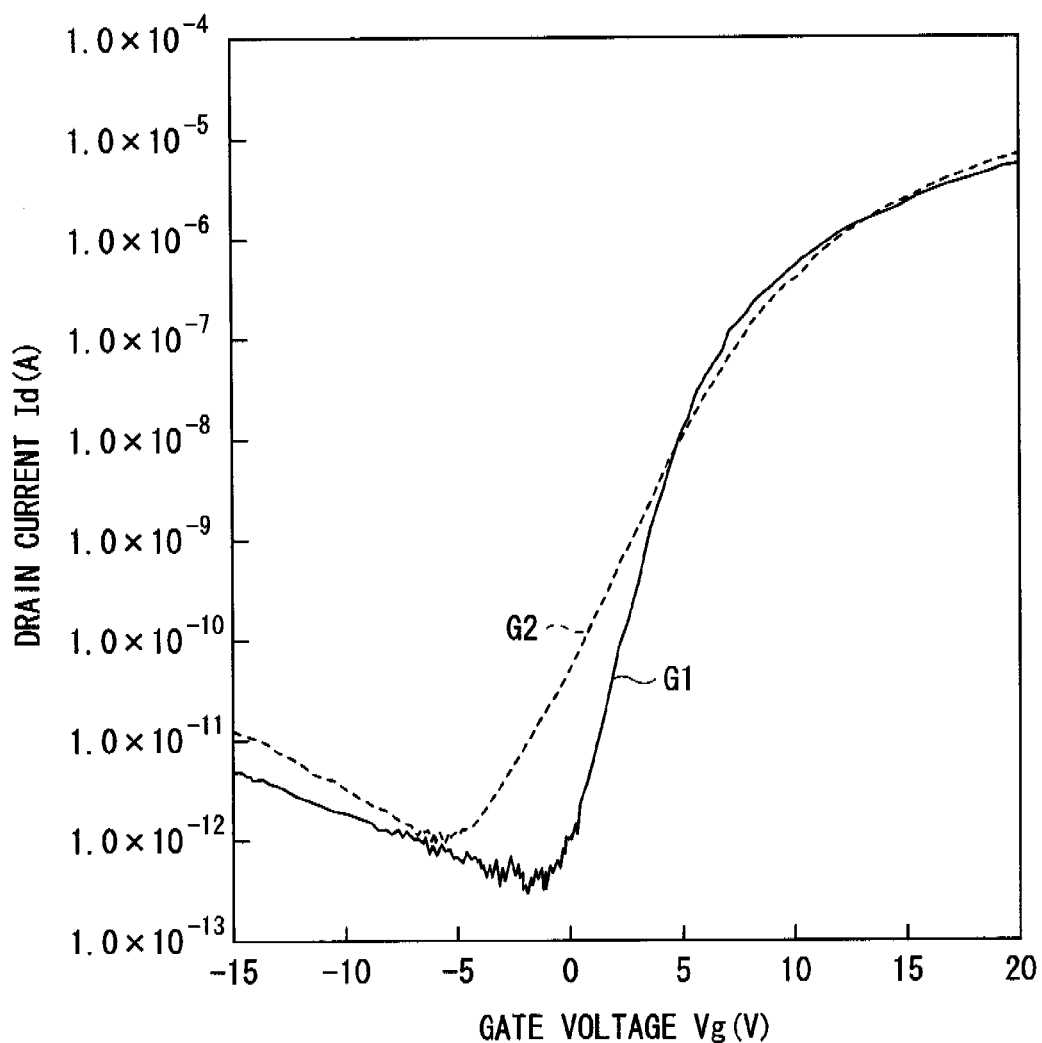
FIG. 9 is a characteristics diagram showing a relation between the gate voltage and the drain current.

Therefore, for example, as evidenced by the transistor characteristics diagram shown in FIG. 9 (relation between the gate voltage Vg and the drain current Id), when the characteristics G1 of the thin film transistor 1 (this embodiment) and the characteristics G2 of the thin film transistor 101 (comparative example) are compared to each other, it is found that the characteristics of the thin film transistor 1 are improved than that of the thin film transistor 101. That is, in the vicinity of the point where the gate voltage Vg is 0 V, the thin film transistor 1 shows the curve more acute than that of the thin film transistor 101 (the drain current Id is rapidly increased). Thus, the so-called S value (slope value) of the thin film transistor 1 is smaller than that of the thin film transistor 101, and therefore the transistor characteristics of the thin film transistor 1 are improved more than that of the thin film transistor 101. The reason thereof may be that in the thin film transistor 1 of this embodiment, the channel region of the crystalline silicon film 13P is protected by the channel protective film and is not damaged as described above.

As above, in this embodiment, the crystalline silicon film 13P is formed by the indirect heat treatment through the photothermal conversion layer 15 and the buffer layer 14. In addition, in the region corresponding to the channel region on the crystalline silicon film 13P, the channel protective film is selectively formed by patterning the buffer layer 14 and the insulating film 16 as an upper layer of the buffer layer 14. The channel protective film functions as an etching stopper when the n+ silicon film 17 and the metal film 18 as an upper layer of the channel protective film are selectively removed. Therefore, heat can be uniformly supplied in forming the crystalline silicon film 13P, and the channel region of the crystalline silicon film 13P can be protected. Therefore, it is possible to suppress the characteristics variation of the thin film transistor 1 without deteriorating the characteristics thereof (for example, increase of the S value, increase of the off-current, lowering of the correlative insulation).

Further, the insulating film 16 is formed on the buffer layer 14, and thus the film thickness of the channel protective film is sufficiently large. Therefore, even in the case that overetching is made to avoid the etching residual when the n+ silicon film 17 and the metal layer 18 are patterned, the channel region of the crystalline silicon film 13P can be surely protected.

Second Embodiment

Next, a description will be given of a method of manufacturing a thin film transistor (thin film transistor 1A) according to a second embodiment of the invention. Elements identical with the elements in the first embodiment are affixed with the identical symbol, and the description thereof will be omitted as appropriate.

Figure 10A:
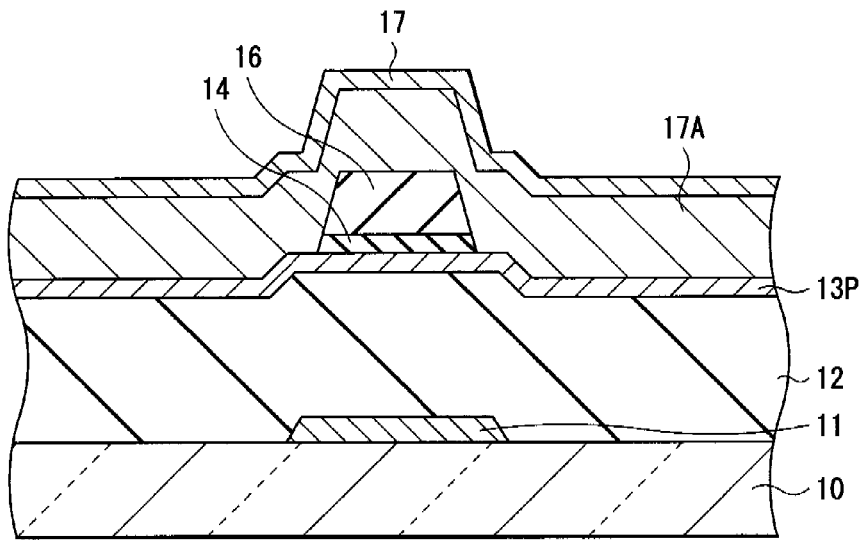
FIGS. 10A and 10B are cross sections showing part of main steps of a method of manufacturing a thin film transistor according to a second embodiment.

First, as shown in FIG. 10A, in the same manner as in the thin film transistor 1 of the first embodiment, the gate electrode 11, the gate insulating film 12, the amorphous silicon film 13A, the buffer layer 14, and the photothermal conversion layer 15 are sequentially formed over the substrate 10. Next, the photothermal conversion layer 15 is uniformly irradiated with the laser beam L1, and heat treatment is indirectly provided for the amorphous silicon film 13A, and thereby the crystalline silicon film 13P is formed. Next, in the same manner as in the thin film transistor 1, the buffer layer 14 and the insulating film 16 are patterned to form the channel protective film.

Next, in this embodiment, an amorphous silicon film 17A being about 120 nm thick is uniformly formed between the crystalline silicon film 13P including the channel protective film and the n+ silicon film 17 by, for example, plasma CVD method. The film thickness of the amorphous silicon film 17A is desirably large as long as possible. As the film thickness is larger, effects to decrease the off-current of the thin film transistor described later are more intensified.

Figure 10B:
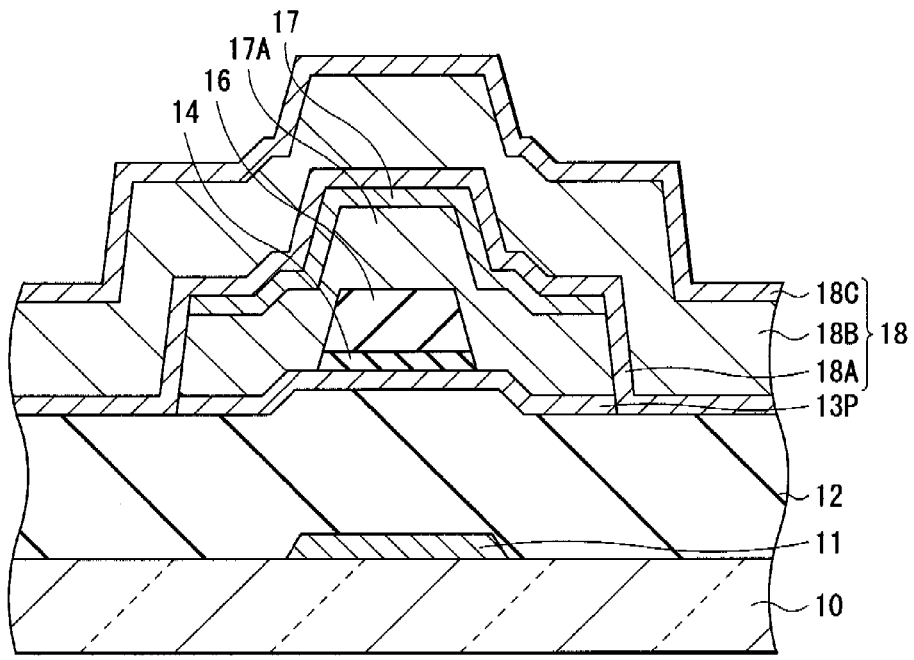

Subsequently, as shown in FIG. 10B, a portion other than a region corresponding to the gate electrode 11 in the crystalline silicon film 13P, the amorphous silicon film 17A, and the n+ silicon film 17 is removed by etching. Thereby, an island pattern composed of the crystalline silicon film 13P, the amorphous silicon film 17A, and the n+ silicon film 17 is formed. Subsequently, in the same manner as in the thin film transistor 1, the three-layer structure metal layer 18 is uniformly formed on the gate insulating film 12 including the n+ silicon film 17.

Figure 11A:
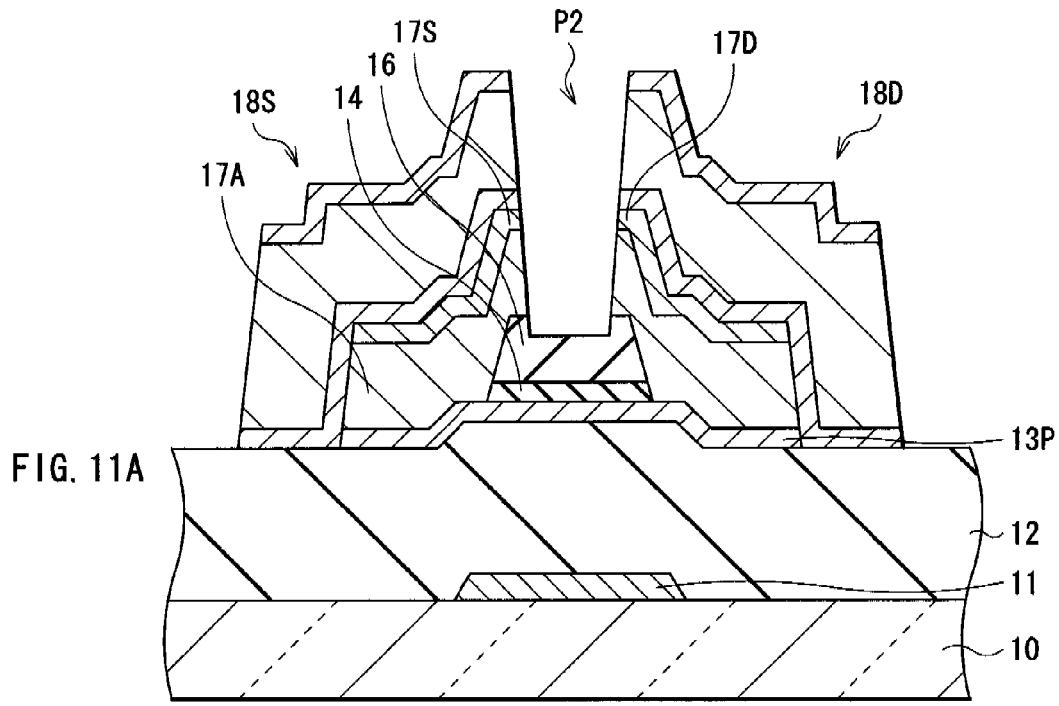
FIGS. 11A and 11B are cross sections showing steps following FIGS. 10A and 10B.

Subsequently, as shown in FIG. 11A, in the same manner as in the thin film transistor 1, with the use of the channel protective film as an etching stopper, the n+ silicon film 17 and the metal layer 18 are patterned in a given shape. Thereby, the source region 17S, the drain region 17S, the source electrode 18S and the drain electrode 18D are respectively formed.

Figure 11B:
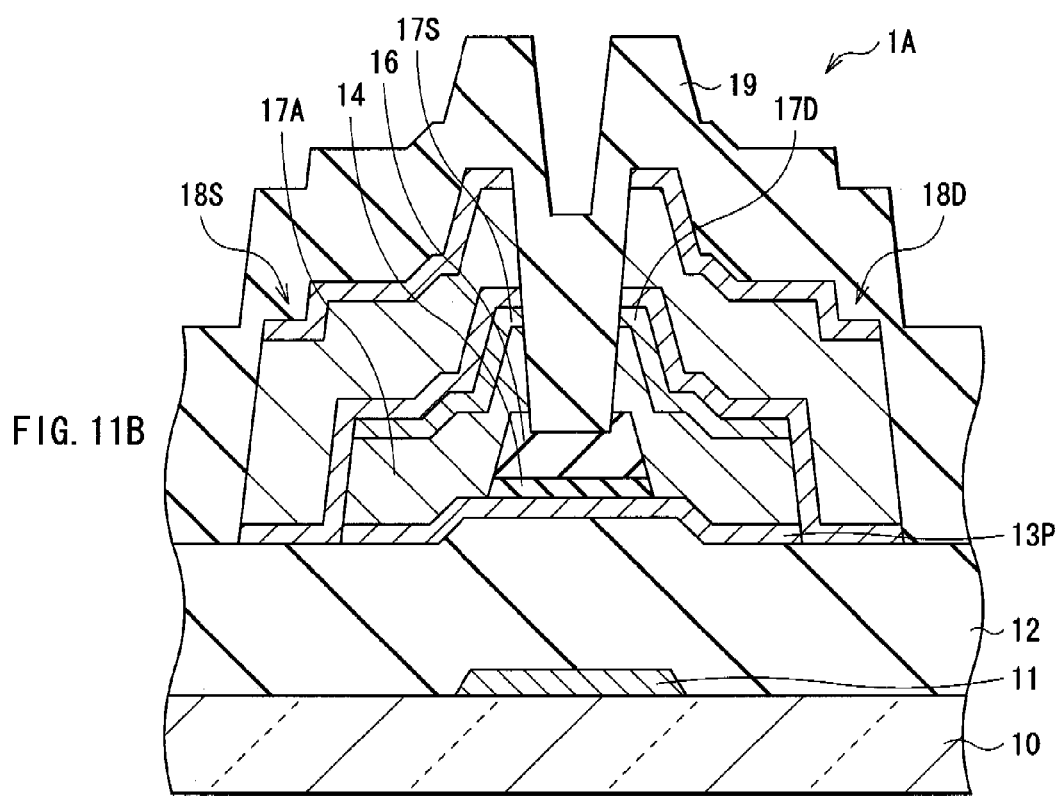

Finally, as shown in FIG. 11B, in the same manner as in the thin film transistor 1, the passivation film 19 is uniformly formed on the gate insulating film 12 including the source electrode 18S, the drain electrode 18D, and the channel protective film. Thereby, the thin film transistor 1A of this embodiment is manufactured.

In the thin film transistor 1A, in the same manner as in the thin film transistor 1, when the gate voltage Vg of the threshold value voltage or more is applied between the gate electrode 11 and the source electrode 18S through a not shown wiring layer, the drain current Id flows between the source electrode 18S and the drain electrode 18D, and thereby the thin film transistor 1A functions as a transistor.

In the thin film transistor 1A, the amorphous silicon film 17A is formed between the crystalline silicon film 13P including the channel protective film and the source region 17S/the drain region 17D formed from the n+ silicon film 17, respectively. Therefore, when the negative potential is given to the gate electrode 11, a depletion layer between the channel and the drain is formed in the amorphous silicon film 17A. Compared to the crystalline silicon layer 13P, in-film hydrogen infills the localized order in the amorphous silicon layer 17A. Therefore, the current generated due to collision of an electron and an electron hole becomes small, and the band gap becomes large. In the result, the off-current of the transistor is more decreased, and the characteristics variation between the thin film transistors can be more suppressed (refer to Japanese Patent Application No. 61-138324).

Further, when the film thickness of the amorphous silicon film 17A is increased, the electric field between the channel and the drain is suppressed. Accordingly, the off-current of the transistor is further decreased.

As above, in this embodiment, the amorphous silicon film 17A is formed between the crystalline silicon film 13P including the channel protective film and the source region 17S/the drain region 17D, respectively. Therefore, in addition to the effects in the first embodiment, the current generated in the localized order can be further suppressed. In the result, the off-current of the transistor is more decreased, and the characteristics variation between the thin film transistors can be more suppressed.

While the invention has been described with reference to the first embodiment and the second embodiment, the invention is not limited to the foregoing embodiments, and various modifications may be made.

Figures 12A, 12B:
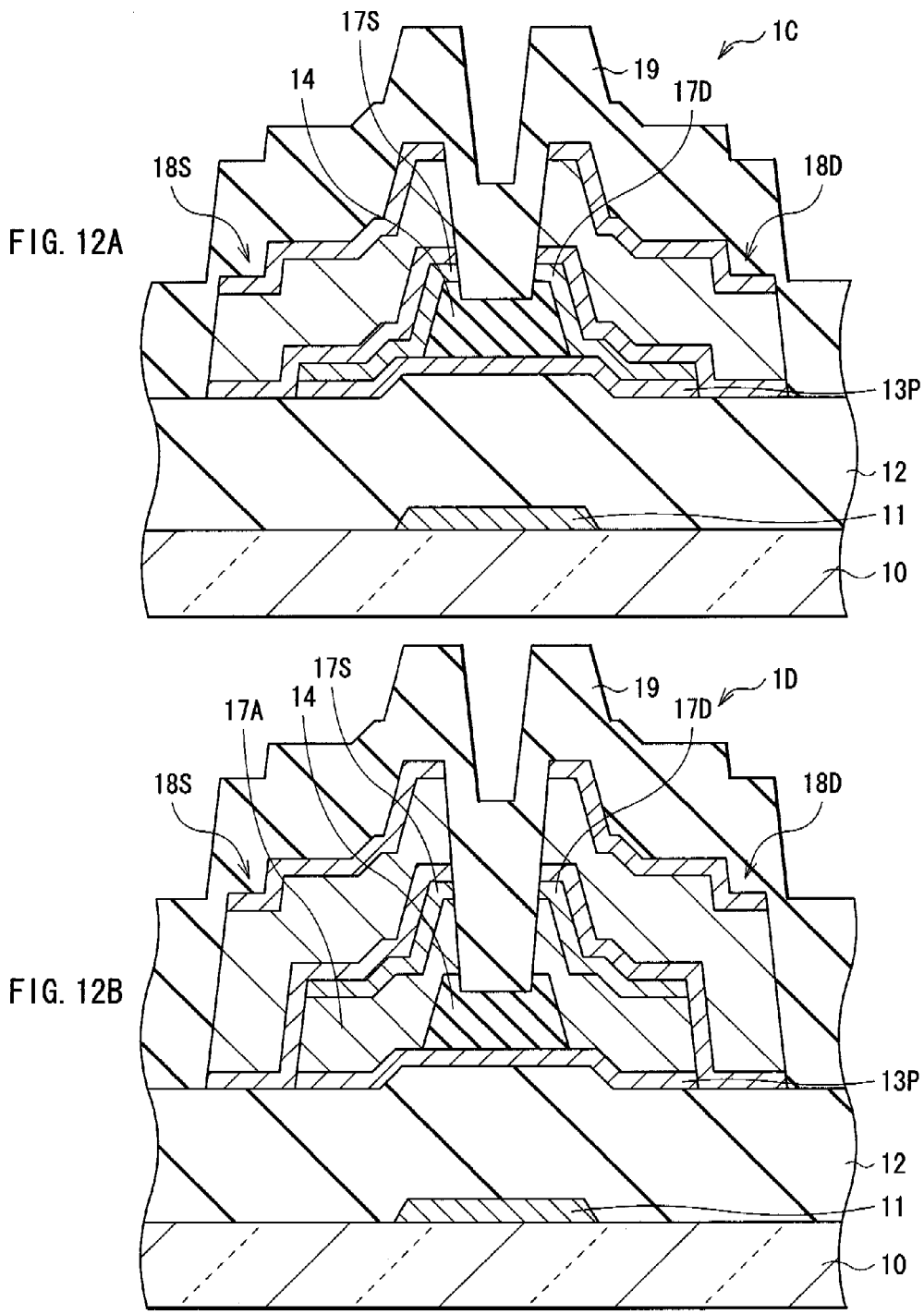
FIGS. 12A and 12B are cross sections showing a structure of a thin film transistor according to a modification of the invention.

For example, in the foregoing embodiments, the description has been given of the case that the channel protective film is composed of the buffer layer 14 and the insulating film 16. However, it is possible that the insulating film 16 is not formed and the channel protective film is composed of only the buffer layer 14, as long as under the condition that the channel region of the crystalline silicon film 13P can be sufficiently protected even if overetching is made in patterning the n+ silicon film 17 and the metal layer 18 (thickness of the buffer layer 14, the degree of the overetching or the like), for example, as thin film transistors 1C and 1D (respectively corresponding to the thin film transistors 1 and 1A) respectively shown in FIGS. 12A and 12B. In this case, it is not necessary to form the insulating film 16. Therefore, in addition to the effects in the foregoing embodiments, the steps of manufacturing the thin film transistor can be simplified. When the buffer layer 14 is formed thick, there is a tendency that heat is hardly transferred to the amorphous silicon film 13A in forming the crystalline silicon film 13P. The thickness of the buffer layer 14 is desirably set by considering such a tendency.

Further, in the foregoing embodiments, the description has been given of the case that before forming the metal layer 18, the island pattern formed of the crystalline silicon film 13P and the n+ amorphous silicon film 17 is formed. However, it is possible that in removal of the n+ silicon film 17 in the region corresponding to the channel region that is made subsequently after forming the metal layer 18, the n+ silicon film 17 in the vicinity of the metal layer 18 and the crystalline silicon film 13P may be continuously removed. Further, it is possible that the n+ silicon film 17 is formed just before forming the metal layer 18, an island pattern formed of only the crystalline silicon film 13P is formed before forming the metal layer 18, and the n+ silicon film 17 in the vicinity of the metal layer 18 is removed in removal of the n+ silicon film 17 in the region corresponding to the channel region that is made subsequently after forming the n+ silicon film 17 and the metal layer 18.

Figure 13:
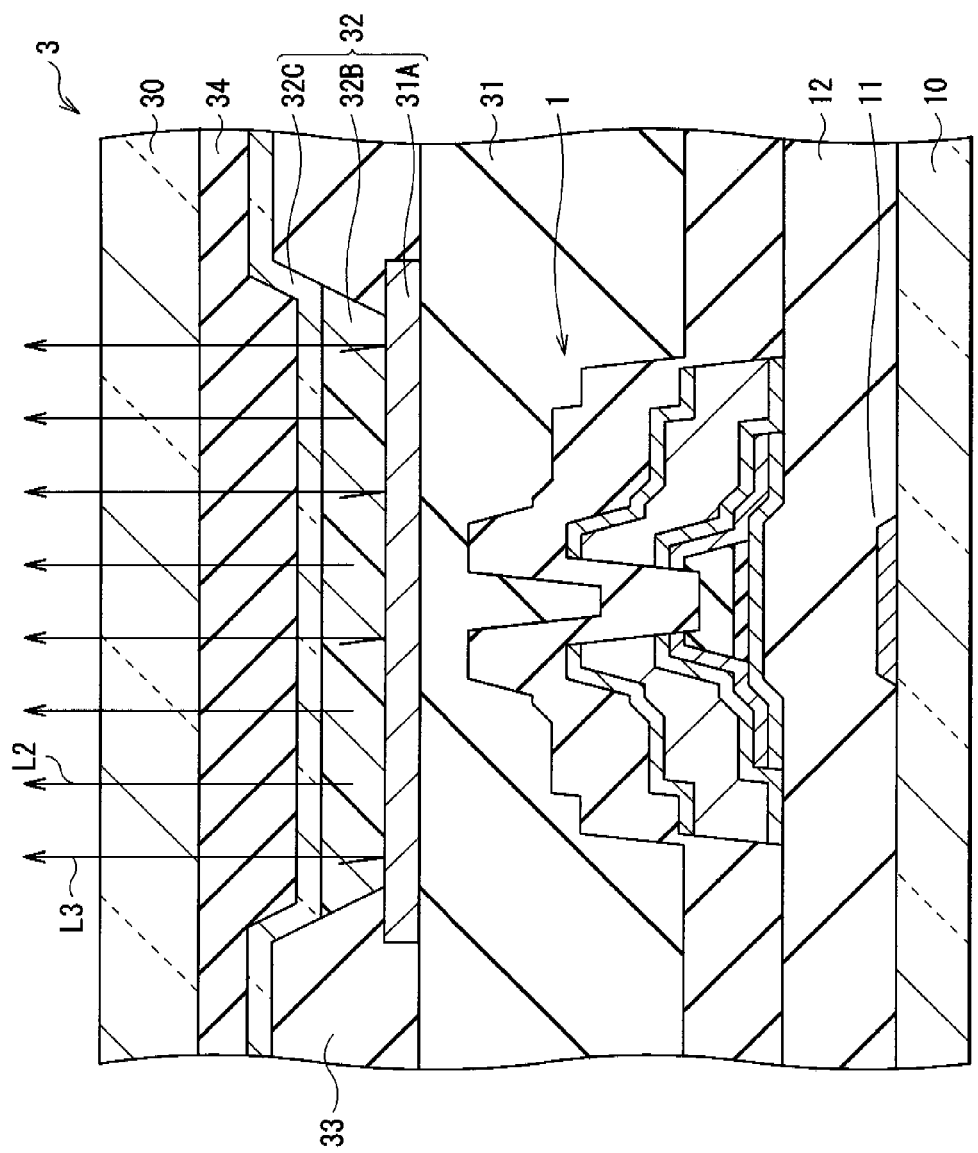
FIG. 13 is a cross section showing a structure of a display unit according to an embodiment of the invention.

Further, for example, as shown in FIG. 13, the thin film transistor of the invention can be applied to an organic EL display unit (organic EL display unit 3) including an organic EL device (organic EL device 32) as a display device. In this case, for example, a plurality of the thin film transistors 1 described in the foregoing embodiment (or one of 1A to 1C) are provided, and each of the plurality of thin film transistors functions as a driving device for the organic EL device 32, respectively. As a specific structure of the organic EL display device 3, for example, the following structure can be cited. That is, an insulative planarizing layer 31 is uniformly formed on the thin film transistor 1 on the substrate 10, the plurality of organic EL devices 32 including a reflective electrode 32A, an organic light emitting layer 32B, and a transparent electrode 32C are formed thereon, each organic EL device 32 is separated from each other by an interelectrode insulating film 33, and an insulative planarizing layer 34 is formed thereon again, and the resultant is sealed by a transmissive substrate 30. In the organic EL display unit 3 having the foregoing structure, when a given voltage is applied between the reflective electrode 32A and the transparent electrode 32C, the organic light emitting layer 32B emits light, which is emitted upward in the figure as emitting light L2 and L3. In the organic EL display unit, effects similar to those of the foregoing embodiments can be obtained by operations similar to those of the foregoing embodiments. In FIG. 13, the so-called top emission type organic EL display unit is described. In addition, for example, application can be made to a so-called bottom emission type organic EL display unit and a dual emission type organic EL display unit.

Further, the thin film transistor of the invention can be applied to, for example, a liquid crystal display unit including a liquid crystal device as a display device, in addition to the organic EL display unit including the organic EL device as shown in FIG. 13. In this case, it is also possible that effects similar to those of the foregoing embodiments can be obtained by operations similar to those of the foregoing embodiments.

Further, materials, thicknesses, film forming methods, and film forming conditions of the respective elements are not limited to the materials, the thicknesses, the film forming methods, and the film forming conditions of the respective elements that have been described in the foregoing embodiments. Other materials, thicknesses, film forming methods, and film forming conditions may be applied.

Further, in the foregoing embodiments, the structures of the thin film transistor and the organic EL display unit have been described with reference to the specific examples. However, it is not necessary to provide all layers, and it is possible to further provide other layers.

It should be understood by those skilled in the art that various modifications, combinations, sub-combinations and alternations may occur depending on design requirements and other factors insofar as they are within the scope of the appended claims or the equivalents thereof.

What is claimed is:

1. A method of manufacturing a thin film transistor comprising the steps of:
    forming a gate electrode, a gate insulating film, a first amorphous silicon film, and a first insulating layer over an insulative substrate in this order;
    forming a photothermal conversion layer on the first insulating layer;
    forming a crystalline silicon film by crystallizing the first amorphous silicon film by irradiating the photothermal conversion layer with a light beam to provide heat treatment for the first amorphous silicon film through the photothermal conversion layer and the first insulating layer;
    removing the photothermal conversion layer;
    forming a second insulating layer on the first insulating layer after said removal of the photothermal conversion layer;
    forming a channel protective film by patterning the first and second insulating layers to selectively leave only a region thereof corresponding to a channel region of the crystalline silicon film; and
    forming a source region and a drain region from an n+ silicon film and forming a source electrode and a drain electrode from a metal layer by forming the n+ silicon film and the metal layer on the channel protective film and the crystalline silicon film in this order, patterning the crystalline silicon film and the n+ silicon film to selectively leave only a region thereof corresponding to the gate electrode, and selectively removing a region corresponding to the channel region in the n+ silicon film and the metal layer with the use of the channel protective film as an etching stopper.

2. The method of manufacturing a thin film transistor according to claim 1 comprising the step of:
    forming a second amorphous silicon film between the channel protective film, the crystalline silicon film and the n+ silicon film.

3. The method of manufacturing a thin film transistor according to claim 1, wherein the first insulating layer is formed from a material composed of at least one selected from the group consisting of silicon dioxide ($SiO_2$), silicon nitride (SiN), and silicon oxide nitride (SiON).

* * * * *